United States Patent
Wargo et al.

(10) Patent No.: US 7,014,727 B2
(45) Date of Patent: Mar. 21, 2006

(54) METHOD OF FORMING HIGH RESOLUTION ELECTRONIC CIRCUITS ON A SUBSTRATE

(75) Inventors: Christopher Wargo, Highland Park, NJ (US); Paul Kydd, Lawrenceville, NJ (US); Scott Mathews, Germantown, MD (US); Michael Duignan, deceased, late of Washington, DC (US); by Susan Gordon, legal representative, Washington, DC (US); Chengping Zhang, Rockville, MD (US); Todd A. Kegresse, Catonsville, MD (US)

(73) Assignees: Potomac Photonics, Inc., Lanham, MD (US); Parelec, Inc., Rocky Hill, NJ (US)

( * ) Notice: Subject to any disclaimer, the term of this patent is extended or adjusted under 35 U.S.C. 154(b) by 239 days.

(21) Appl. No.: 10/612,904

(22) Filed: Jul. 7, 2003

(65) Prior Publication Data

US 2005/0006335 A1    Jan. 13, 2005

(51) Int. Cl.
*B29C 65/02* (2006.01)
*B29C 65/50* (2006.01)
*B32B 37/12* (2006.01)
*B32B 38/04* (2006.01)
*B05D 5/12* (2006.01)

(52) U.S. Cl. .................. 156/247; 156/248; 156/257; 29/25.01; 427/63; 427/96.1; 427/290

(58) Field of Classification Search ............. 427/63, 427/96.1, 101, 102, 118, 271, 272, 282, 289, 427/290; 156/257, 268, 344, 242, 244.12, 156/245–248; 438/759, 780, 951; 29/25.01, 29/25.02, 25.03; 83/875
See application file for complete search history.

(56) References Cited

U.S. PATENT DOCUMENTS

| | | | |
|---|---|---|---|
| 3,923,697 A * | 12/1975 | Ellis | ................ 252/506 |
| 3,956,052 A * | 5/1976 | Koste et al. | ........... 156/247 |
| 4,336,320 A | 6/1982 | Cummings et al. | |
| 4,417,393 A | 11/1983 | Becker | |
| 4,508,753 A | 4/1985 | Stepan | |
| 4,710,253 A | 12/1987 | Soszek | |
| 4,763,403 A | 8/1988 | Klein et al. | |
| 4,912,844 A | 4/1990 | Parker | |
| 4,959,119 A | 9/1990 | Lantzer | |
| 5,091,339 A | 2/1992 | Carey | |
| 5,233,157 A * | 8/1993 | Schreiber et al. | ...... 219/121.68 |

(Continued)

OTHER PUBLICATIONS

Vanheusden, et al., "Advanced Materials System for Ultra-Low Temperature, Digital, Direct-Write Technologies", Direct-Write Technologies for Rapid Prototyping Applications, Academic Press, San Diego, 2002, pp. 123-174.

(Continued)

*Primary Examiner*—Chris Fiorilla
*Assistant Examiner*—Sing P. Chan
(74) *Attorney, Agent, or Firm*—Rosenberg, Klein & Lee

(57) ABSTRACT

A method of forming high resolution electronic circuits (10) on a substrate (12) is provided. The method includes the steps of laminating a dielectric layer (14) on a substrate (12), laser drilling channels (16 and 18) in the dielectric film (14) and the substrate (12), and filling channels (16 and 18) with a filler material (20). Further, a release layer (22) is applied to dielectric film layer (14) and filler material (20), the release layer (22) having an adhesive thereon. Release layer (22) is peeled or otherwise removed from substrate (12), leaving filler material (20) formed and shaped on substrate (12), thus producing a high resolution electronic circuit on substrate (12).

20 Claims, 2 Drawing Sheets

U.S. PATENT DOCUMENTS

| | | | |
|---|---|---|---|
| 5,263,957 A | 11/1993 | Davison | |
| 5,422,190 A | 6/1995 | Alexander | |
| 5,466,325 A * | 11/1995 | Mizuno et al. | 156/344 |
| 5,576,073 A | 11/1996 | Kickelhain | |
| 5,609,704 A | 3/1997 | Hayama et al. | |
| 5,666,722 A | 9/1997 | Tamm et al. | |
| 5,882,722 A | 3/1999 | Kydd | |
| 6,036,889 A | 3/2000 | Kydd | |
| 6,143,356 A | 11/2000 | Jablonski | |
| 6,163,957 A | 12/2000 | Jiang et al. | |
| 6,245,663 B1 * | 6/2001 | Zhao et al. | 438/622 |
| 6,378,424 B1 * | 4/2002 | Hayama et al. | 101/170 |
| 6,379,745 B1 | 4/2002 | Kydd et al. | |

OTHER PUBLICATIONS

"Electronic Packaging and Interconnect Handbook", 1991, pp. 7.1-7.19.

* cited by examiner

METHOD OF FORMING HIGH RESOLUTION ELECTRONIC CIRCUITS ON A SUBSTRATE

BACKGROUND OF THE INVENTION

1. Field of the Invention

The subject invention relates to a method of forming high resolution electronic circuits on a substrate. In particular, the present invention directs itself to a processing method including the steps of: laminating a substrate with a layer of dielectric film, laser drilling the dielectric film to form a series of channels, filling the channels with an electrically conductive material, applying a release layer to the upper surface of the dielectric film, and removing the release layer, thereby exposing the electrically conductive material formed and patterned on the upper surface of the substrate. More particularly, this invention directs itself to a method of fabricating electronic circuits on a substrate where the laser drilling step allows for the creation of patterns for the electronic circuitry of variable size, shape, and depth on or in the substrate.

2. Prior Art

Methods for forming electronic circuitry on substrates are well-known in the art. In general, such prior art methods include a building process wherein thin layers of dielectric and electrically conductive material are sequentially formed on a base substrate using conventional semiconductor processing techniques. Dielectric layers are typically formed by the sequential steps of spin-coating the dielectric material, curing, pattern-etching with a plasma etch process to form via apertures, and filling the apertures by electroplating or sputtering. The metal layers are typically formed by sequential steps of sputtering a thin chromium layer (for adhesion to the dielectric layer), sputtering an initial copper layer over the chromium layer, defining the electrical traces by either additive or subtractive methods, and removing the excess copper and chromium between the electrical traces.

Typical additive methods use a thin initial copper layer (called a seed layer), then form a photoresist layer over the thin copper layer and pattern it to remove photoresist where the signal traces are to be located, and thereafter plate a much thicker copper layer into the photoresist pattern. Typical subtractive methods use a thick initial copper layer, then form a photoresist layer over the thick copper layer and pattern it in order to remove photoresist in areas where there are signal traces. Thereafter, exposed copper is etched away. The aforementioned building process involves numerous steps and is a relatively expensive procedure. A defect in the formation of one layer may ruin the entire substrate. Current trends in the industry are biased toward increasing the density of signal lines and vias. This, in turn, increases cost of the building process and further increases the chances of a defect occurring.

It is a purpose of the subject invention to provide a method for creating electrical circuitry on a substrate which reduces manufacturing costs and defects and, thusly, enables board manufacturers to keep up with the demands of the semiconductor and circuitry industries.

One such prior art method of forming electrical circuitry on a substrate is shown in U.S. Pat. No. 6,163,957. This reference is directed to a multi-layer laminated substrate with high density interconnects and methods of making the same. The method includes the steps of laminating a substrate with a dielectric material, milling the substrate and dielectric material, and filling the newly formed channels with an electrically conductive substance. The process, however, does not include the steps of baking the electrically conductive material once it has been inserted into the channels, which is necessary for uniformity and strength, nor does it include the step of applying a release layer to remove the unwanted remains of an upper dielectric layer.

Another such prior art method of forming electrical circuitry on a substrate is shown in U.S. Pat. No. 5,576,073. This reference is directed to a method for patterned metallization of a substrate surface. The method includes the steps of laminating a substrate with a dielectric layer, laser drilling channels into the dielectric layer and filling the channels with an electrically conductive substance. The method, however, does not include the steps of baking the electrically conductive material or applying a release layer for removing unwanted remains of an upper dielectric layer.

U.S. Pat. No. 4,710,253 is directed to a method for manufacturing a circuit board. This method includes the steps of layering a conductive powder on a dielectric substrate and irradiating the powder in predetermined shapes and patterns to form permanent circuitry. The method, however, does not include the efficient step of preforming channels in the dielectric layer and then filling them with an electrically conductive material. Nor does it include the step of applying a release layer for removal of unwanted dielectric residue.

U.S. Pat. No. 4,417,393 is directed to a method of fabricating high density electronic circuits having very narrow conductors. This method includes the steps of laser etching channels into a dielectric surface and filling the channels with an electrically conductive material. The electrically conductive material, however, is not baked, nor is it covered with a release layer for removal of unwanted dielectric film.

Another prior art system is shown in U.S. Pat. No. 6,143,356. This reference is directed to a diffusion barrier and adhesive for Parmod application to rigid printing wiring boards. Parmod compositions comprise metal powder mixed with a reactive organic medium, these compositions being applied to temperature-sensitive substrates and cured to well-consolidated, well-bonded circuit traces by beat treatment at a temperature which does not damage the substrate. This system does not include a laser milling and subsequent filling process.

None of the prior art provides for a combination of steps as herein presented comprising a method for forming electronic circuits on a substrate which allows for a maximum of efficiency and cost effectiveness with a minimum of defects. None of the prior art methods include the combined steps of laminating a substrate with a dielectric film, laser milling channels into both the dielectric film and the substrate, filling the channels with an electrically conductive material and subsequently baking the electrically conductive material in order to shape and strengthen the system, and then applying a release layer to adhesively remove the unwanted dielectric film from the top of the substrate.

SUMMARY OF THE INVENTION

The present invention provides for a method for creating high resolution electronic circuits on a substrate. The method includes the steps of laminating a dielectric layer on a substrate, laser milling channels into both the dielectric layer and the substrate, filling the channels with an electrically conductive material, laminating a release layer on top of the dielectric layer and removing the release layer, which adhesively removes the remaining dielectric residue. Further, prior to the lamination of the release layer on top of the dielectric layer, the electrically conductive material is baked, which allows for shaping of the electrically conductive material, strengthening the material and, importantly, removing impurities within the electrically conductive material. Once the release layer has been removed, an electrical circuit is formed on the substrate, composed only of the electrically conductive material and the substrate material.

It is a principle objective of the subject method of forming high resolution electronic circuits on a substrate to provide an efficient process for creating electrical circuitry on a substrate material.

It is a further objective of the subject method of forming high resolution electronic circuits on a substrate to provide a method where channels are formed in both the dielectric layer and the substrate material.

It is a further objective of the subject invention to provide a method of forming high resolution electronic circuits on a substrate where the electrically conductive material is baked in order to shape the material, increase the material's strength and remove impurities from the electrically conductive material.

It is an important objective of the present invention to provide a method of forming high resolution electronic circuits on a substrate which includes the steps of laminating a release layer onto the dielectric layer and removing the release layer, which adhesively removes the remains of the dielectric layer. The remaining electrical circuitry consists only of the electrically conductive material and the substrate material.

DESCRIPTION OF THE PREFERRED EMBODIMENTS

Figure 4:
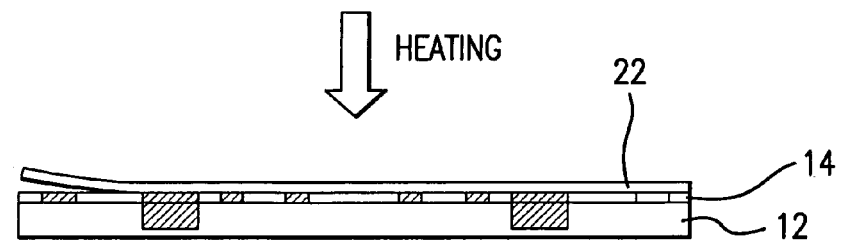
FIG. 4 is a cross-sectional view of the substrate and dielectric layer with a release layer being located on an upper surface of the dielectric film layer.
Figure 5:
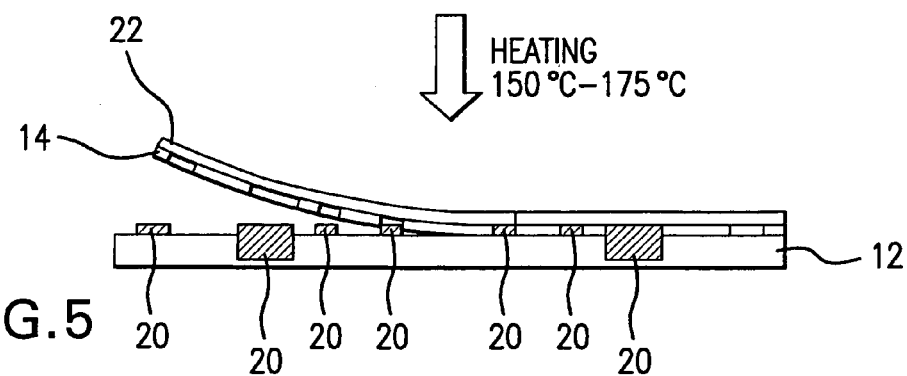
FIG. 5 is a cross-sectional view of the release layer being removed from the upper surface of the dielectric film layer; and, FIG. 6 is a perspective schematic view of a high resolution circuit formed on the substrate layer.
Figure 6:
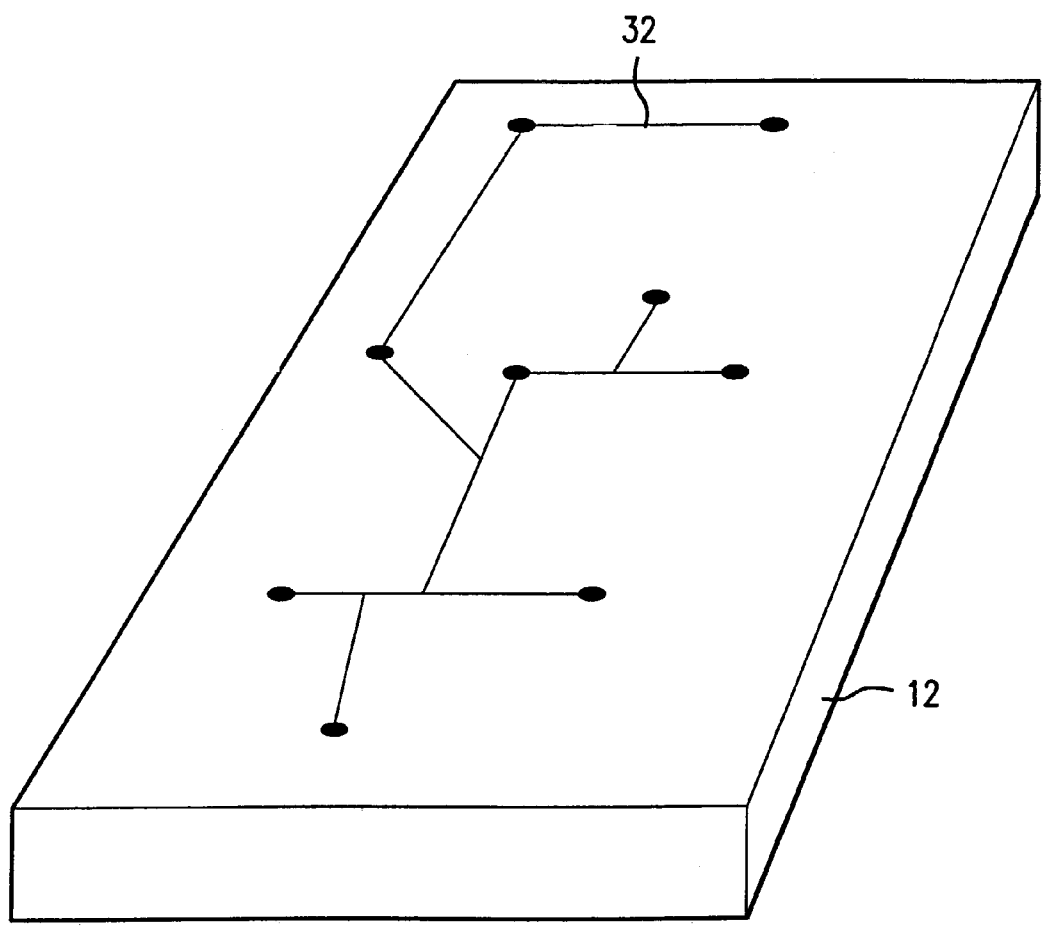

Referring now to FIGS. 1–6, there is shown a method of forming high resolution electronic circuits on a substrate. In FIG. 6, a high resolution electronic circuit 10 is fabricated on a substrate 12. Substrate 12 may be a glass, an aluminum alloy, a polyimide film, or any other suitable substrate composition.

One such substrate composition which may be used for substrate layer 12 is a polyimide film known as Kapton, which is produced by DuPont High Performance Materials of Circleville, Ohio. Kapton polyimide films are dielectric films which retain their physical properties over a wide temperature range. They have been used in field applications where the environmental temperatures were as low as −269° C. and as high as 400° C.

Figure 1:
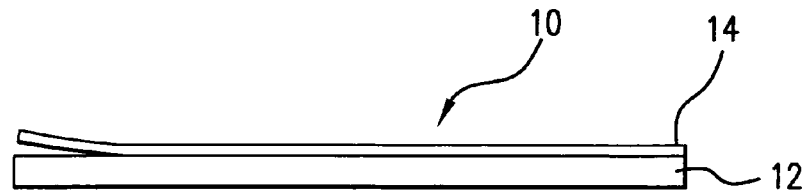
FIG. 1 is a cross-sectional view of a dielectric film layer being laminated on a substrate.

FIG. 1 illustrates a layer of dielectric film 14 being laminated to substrate 12. Dielectric film layer 14 may also be a layer of Kapton. The dielectric layer 14 is laminated on substrate 12 using applied heat and pressure.

Figure 2:
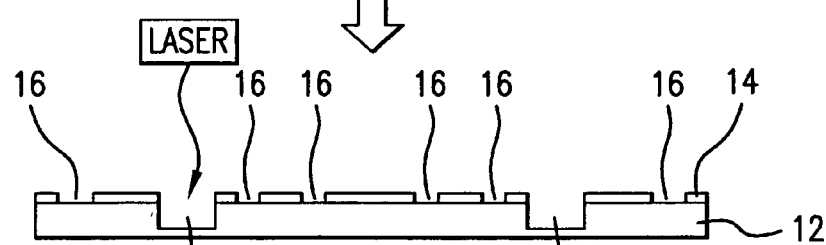
FIG. 2 is a cross-sectional view of the dielectric film layer and the substrate after the step of laser drilling.

FIG. 2 illustrates the second step in the method for forming high resolution electronic circuits on a substrate 12. As shown in FIG. 2, channels 16 and 18 are formed in dielectric layer 14 and substrate 12. Channels 16 and 18 are formed using a laser, or other source of directed radiation. If Kapton is used for forming the dielectric film layer 14 and/or the substrate layer 12, an ultraviolet laser would be useful for milling channels 16 and 18.

Substrate layer 12 may have a typical thickness of approximately 5 mil. Lamination layer 14 is approximately 0.25 mil to 1 mil thick. Additionally, if needed, a thin layer of adhesive (not shown) may be added between substrate 12 and thin dielectric film layer 14.

As shown in FIG. 2, channels 16 are formed only in the thin dielectric film layer 14. Channels 18, however, are formed in both the dielectric film layer 14 and substrate 12. Thus, it is necessary to use a laser milling device (not shown) which allows for drilling to an adjustable depth. Channels 16 and 18 are formed following predetermined sizes, shapes and depths. Channels 16 and 18 are formed following the size, shape and depth parameters of the desired electronic circuit.

Figure 3:
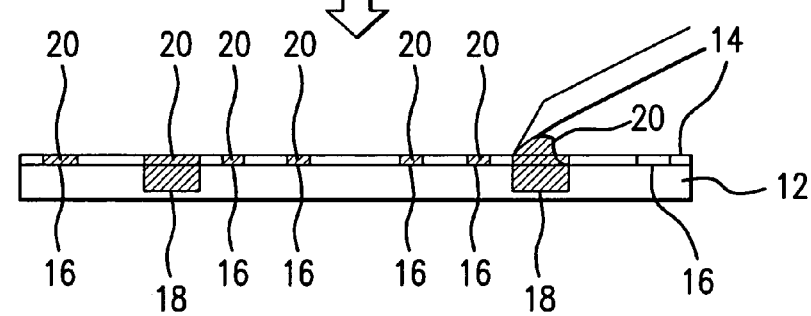
FIG. 3 is a cross-sectional view of the substrate and dielectric film layer having laser drilled channels filled with an electrically conductive substance.

FIG. 3 illustrates the third step in the method of forming high resolution electronic circuits on a substrate 12. In FIG. 3, channels 16 and 18, formed in dielectric layer 14 and substrate 12, respectively, are filled with material 20. Material 20 may be a conductive material, a dielectric material, a resistor paste, a ceramic composition, or any other type of material desired to be formed on substrate 12. Conductive silver and conductive copper alloys form typical commercially available electronic inks which may be deposited on substrate 12 in the form of material 20.

Material 20 may be applied to the high resolution circuit 10 using an injection molding process, a squeegee, or any other suitable method.

Following the filling of channels 16 and 18 with material 20, the substrate 12, the dielectric film layer 14, and the material 20 may be heated in order to bake the material 20. Baking material 20 will allow material 20 to melt and/or set within channels 16 and 18. Depending on the composition of material 20, the volume of material 20 within channels 16 and 18 may decrease during the baking process. Should this occur, the third step in the method of forming high resolution electronic circuits 10 on a substrate 12 may be repeated; i.e., an additional quantity of material 20 may be added to channels 16 and 18 and heated or baked a second time.

The substrate 12, dielectric film layer 14, and filler material 20 may be heated through use of a standard convection-type oven. Additionally, the substrate 12, dielectric film layer 14, and filler material 20 may be heated using a conductive process or through radiant heat transfer.

The additional step of heating the electrically conductive material 20 allows for both the shaping and setting of the material within the channels 16 and 18. Further, the heating and baking increases the strength of the material 20 and also forms a permanent bond between the material 20 and substrate 12, which is necessary for forming permanent electronic circuitry on substrate 12. Further, the heating and baking of material 20 burns off, to some extent, impurities within the material 20. Thus, the electrical conductive properties of material 20 are enhanced by the baking process.

FIG. 4 illustrates the fourth step in the method of forming high resolution electronic circuits 10 on a substrate 12. As shown, a release layer 22 is laminated onto an upper surface of dielectric film layer 14 and filler material 20. Release layer 22 has an upper surface and a lower surface, the lower surface being coated with an adhesive material. The release layer 22 may be an acrylic-coated polyester, or any other suitable adhesive tape.

Depending on the composition of the materials used, the substrate 12, thin dielectric film layer 14, filling material 20, and the release layer 22 may be heated or baked in order to increase the adhesion between the adhesive on release layer 22 and the dielectric film layer 14. This additional heating also adds further mechanical integrity, or adhesion, between filler material 20 and substrate 12.

Typically, using a 1–2 micron thick silver powder composition as filler material 20, the substrate 12, thin dielectric film layer 14, filling material 20, and release layer 22 would be heated to approximately 150° C.–175° C.

FIG. 5 illustrates the fifth and final step in the method of forming high resolution electronic circuits on a substrate 12. In FIG. 5, release layer 22 is peeled or otherwise removed from substrate 12 and filling material 20. As shown in FIG. 5, dielectric film layer 14 adheres to release layer 22, thus leaving shaped and set filler material 20 on substrate 12.

Once release layer 22 has been removed, a high resolution circuit remains in the form of filler material 20 permanently formed in desired shapes and patterns on substrate 12.

The resulting electronic circuit comprises only filler material 20 and the substrate material 12. The release layer 22 removes all of the remaining dielectric layer 14 from the substrate 12. Thus, unlike the prior art systems, an electrical circuit is formed of only the two materials, the conductive material 20 and the substrate material 12. This greatly improves the efficiency and adaptability of the electronic circuit forming process.

Although this invention has been described in connection with specific forms and embodiments thereof, it will be appreciated that various modifications other than those discussed above may be resorted to without departing from the spirit or scope of the invention. For example, functionally equivalent elements may be substituted for those specifically shown and described, proportional quantities of the elements shown and described may be varied, and in the formation method steps described, particular steps may be reversed or interposed, all without departing from the spirit or scope of the invention as defined in the appended claims.

What is claimed is:

1. A method of forming high resolution electronic circuits on a substrate, comprising the steps of:
   (a) laminating an upper surface of said substrate with a layer of dielectric film, said layer of dielectric film having an upper surface and a lower surface, said lower surface of said layer of dielectric film being contiguous with said upper surface of said substrate;
   (b) laser drilling said upper surface of said layer of dielectric film to form at least one channel in said layer of dielectric film;
   (c) filling said at least one channel with an electrically conductive material;
   (d) applying a release layer to said upper surface of said layer of dielectric film, said release layer having an upper surface and a lower surface, said lower surface of said release layer being coated with an adhesive layer, said adhesive layer being contiguous with and adhering to said upper surface of said layer of dielectric film;
   (e) heating said substrate, said layer of dielectric film, said electrically conductive material in said at least one channel, and said release layer to a temperature in a range of approximately 150° C.–175° C. to enhance mechanical integrity of said conductive material within said at least one channel and to create permanent adhesion between said conductive material and said upper surface of said substrate; and
   (f) removing said release layer and said layer of dielectric film adhered thereto from said substrate, thereby exposing said electrically conductive material formed, patterned and remaining permanently on said upper surface of said substrate.

2. The method of forming high resolution electronic circuits on a substrate as recited in claim 1, further comprising a step of laser drilling said substrate to form at least one substrate channel in said substrate.

3. The method of forming high resolution electronic circuits on a substrate as recited in claim 1 wherein said electrically conductive material includes silver.

4. The method of forming high resolution electronic circuits on a substrate as recited in claim 1 wherein said electrically conductive material includes copper.

5. The method of forming a high resolution electronic circuit on a substrate as recited in claim 1, wherein the step of filling said at least one channel with said electrically conductive material is followed by heating said substrate, said layer of dielectric film, and said electrically conductive material.

6. The method of forming high resolution electronic circuits on a substrate as recited in claim 5, wherein the step of heating said substrate, said layer of dielectric film, and said electrically conductive material is followed by the application of a second layer of said electrically conductive material to said at least one channel.

7. The method of forming high resolution electronic circuits on a substrate as recited in claim 1 wherein said release layer is an acrylic coated polyester tape.

8. The method of forming high resolution electronic circuits on a substrate as recited in claim 1 wherein the step of laser drilling uses an ultraviolet laser.

9. The method of forming high resolution electronic circuits on a substrate as recited in claim 1, wherein said substrate is a polyimide.

10. The method of forming high resolution electronic circuits on a substrate as recited in claim 1 wherein said layer of dielectric film is a polymer layer.

11. A method of forming high resolution electronic circuits on a substrate, comprising the steps of:
   (a) laminating an upper surface of said substrate with a layer of dielectric film, said layer of dielectric film having an upper surface and a lower surface, said lower surface of said layer of dielectric film being contiguous with said upper surface of said substrate;
   (b) laser drilling said upper surface of said layer of dielectric film to form at least one channel in said layer of dielectric film;
   (c) filling said at least one channel with an electrically conductive material;
   (d) heating said substrate, said layer of dielectric film, and said electrically conductive material in order to bake and set said electrically conductive material;
   (e) applying a release layer to said upper surface of said layer of dielectric film, said release layer having an upper surface and a lower surface, said lower surface being coated with an adhesive layer, said adhesive layer being contiguous with and adhering to said upper surface of said layer of dielectric film;
   (f) heating said substrate, said layer of dielectric film, said electrically conductive material in said at least one channel, and said release layer to a temperature in a range of approximately 150° C.–175° C. to enhance mechanical integrity of said conductive material within said at least one channel and to create permanent adhesion between said conductive material and said upper surface of said substrate; and (g) removing said release layer and said layer of dielectric film adhered thereto from said substrate, thereby exposing said electrically conductive material formed, patterned and remaining permanently on said upper surface of said substrate.

12. The method of forming high resolution electronic circuits on a substrate as recited in claim 11, further comprising a step of laser drilling said substrate to form at least one substrate channel in said substrate.

13. The method of forming high resolution electronic circuits on a substrate as recited in claim 11 wherein said electrically conductive material includes silver.

14. The method of forming high resolution electronic circuits on a substrate as recited in claim 11 wherein said electrically conductive material includes copper.

15. The method of forming a high resolution electronic circuit on a substrate as recited in claim 11 wherein the step of heating said substrate, said layer of dielectric film and said electrically conductive material is accomplished through radiant heat transfer.

16. The method of forming high resolution electronic circuits on a substrate as recited in claim 11, wherein the step of heating said substrate, said layer of dielectric film and said electrically conductive material is followed by the application of a second layer of said electrically conductive material to said at least one channel.

17. The method of forming high resolution electronic circuits on a substrate as recited in claim 11 wherein said release layer is an acrylic coated polyester tape.

18. The method of forming high resolution electronic circuits on a substrate as recited in claim 11 wherein the step of laser drilling uses an ultraviolet laser.

19. The method of forming high resolution electronic circuits on a substrate as recited in claim 11, wherein said substrate is a polyimide.

20. The method of forming high resolution electronic circuits on a substrate as recited in claim 11 wherein said layer of dielectric film is a polymer layer.

* * * * *